United States Patent
Hishinuma et al.

(10) Patent No.: US 7,053,312 B2
(45) Date of Patent: May 30, 2006

(54) FLEXIBLE WIRING BOARDS

(75) Inventors: Hiroyuki Hishinuma, Kanuma (JP); Hideyuki Kurita, Yokohama (JP); Ryo Ito, Kanuma (JP); Masayuki Nakamura, Kanuma (JP)

(73) Assignees: Sony Corporation, Tokyo (JP); Sony Chemicals Corp., Tokyo (JP)

( * ) Notice: Subject to any disclaimer, the term of this patent is extended or adjusted under 35 U.S.C. 154(b) by 119 days.

(21) Appl. No.: 10/640,401

(22) Filed: Aug. 14, 2003

(65) Prior Publication Data

US 2004/0045157 A1 Mar. 11, 2004

Related U.S. Application Data

(62) Division of application No. 09/744,572, filed as application No. PCT/JP99/04067 on Jul. 29, 1999, now Pat. No. 6,643,923.

(30) Foreign Application Priority Data

| Jul. 29, 1998 | (JP) | .................................. 10-214463 |
| Jul. 9, 1999 | (JP) | .................................. 11-195822 |

(51) Int. Cl.
*H05K 1/00* (2006.01)

(52) U.S. Cl. ..................... 174/254; 174/267; 257/737

(58) Field of Classification Search ................ 174/260, 174/254, 256, 258, 259, 261, 267; 361/760, 361/749, 767, 768, 783; 257/737, 738, 778
See application file for complete search history.

(56) References Cited

U.S. PATENT DOCUMENTS

| 3,896,076 | A | * | 7/1975 | Watanabe et al. ............ 523/440 |
| 5,072,289 | A | * | 12/1991 | Sugimoto et al. ............ 257/737 |
| 5,103,293 | A | * | 4/1992 | Bonafino et al. ............ 257/702 |
| 5,317,801 | A | | 6/1994 | Tanaka et al. |
| 5,350,947 | A | * | 9/1994 | Takekawa et al. .......... 257/702 |
| 5,361,491 | A | | 11/1994 | Oomachi et al. |
| 5,434,452 | A | * | 7/1995 | Higgins, III ................ 257/773 |
| 5,536,677 | A | | 7/1996 | Hubacher |
| 5,575,662 | A | * | 11/1996 | Yamamoto et al. ........... 439/67 |
| 5,600,103 | A | * | 2/1997 | Odaira et al. ................ 174/265 |
| 5,674,595 | A | | 10/1997 | Busacco et al. |
| 5,734,198 | A | * | 3/1998 | Stave ......................... 257/666 |
| 5,759,417 | A | | 6/1998 | Inaba |
| 5,777,387 | A | * | 7/1998 | Yamashita et al. .......... 257/737 |
| 5,821,626 | A | | 10/1998 | Ouchi et al. |
| 5,840,417 | A | * | 11/1998 | Bolger ....................... 428/323 |
| 5,877,559 | A | * | 3/1999 | Takayama et al. .......... 257/773 |
| 5,914,179 | A | | 6/1999 | Inaba |
| 5,949,141 | A | * | 9/1999 | Farnworth et al. .......... 257/737 |

(Continued)

FOREIGN PATENT DOCUMENTS

JP A 04-352387 12/1992

(Continued)

*Primary Examiner*—Kamand Cuneo
*Assistant Examiner*—Ishwar I. B. Patel
(74) *Attorney, Agent, or Firm*—Oliff & Berridge, PLC

(57) ABSTRACT

A flexible wiring board are formed by growing metal bumps using a mask film patterned by photolithography. Fine openings can be formed with good precision, therefore, fine metal bumps can be formed with good precision because laser beam is not used to form opening in a polyimide film. After metal bumps have been formed, the mask film is removed and a liquid resin material is applied and dried to form a coating, which is then cured into a resin film. The coating can be etched at surface portions during coating stage to exposed the tops of metal bumps.

6 Claims, 6 Drawing Sheets

U.S. PATENT DOCUMENTS

| | | | |
|---|---|---|---|
| 6,000,127 A | 12/1999 | Eifuku et al. | |
| 6,011,310 A | 1/2000 | Naito et al. | |
| 6,013,572 A | 1/2000 | Hur et al. | |
| 6,111,317 A | 8/2000 | Okada et al. | |
| 6,130,480 A | 10/2000 | Ohuchi et al. | |
| 6,157,084 A * | 12/2000 | Hino et al. | 257/773 |
| 6,252,176 B1 | 6/2001 | Kuramochi et al. | |
| 6,294,316 B1 | 9/2001 | Kaneda et al. | |
| 6,404,051 B1 | 6/2002 | Ezawa et al. | |

FOREIGN PATENT DOCUMENTS

| | | | |
|---|---|---|---|
| JP | A 05-082944 | 4/1993 | |
| JP | A 05-121863 | 5/1993 | |
| JP | 6-112274 | 4/1994 | |
| JP | A 06-204651 | 7/1994 | |
| JP | A 06-216258 | 8/1994 | |
| JP | A 07-131138 | 5/1995 | |
| JP | 7-183646 | 7/1995 | |
| JP | 8-31871 | 2/1996 | |
| JP | A 08-111583 | 4/1996 | |
| JP | 08148825 A | 6/1996 | |
| JP | 9-102658 | 4/1997 | |
| JP | A 10-004121 | 1/1998 | |
| JP | A 10-135599 | 5/1998 | |
| JP | 410270505 A | 10/1998 | |
| JP | 11017315 A | 1/1999 | |
| JP | 11017331 A | 1/1999 | |

* cited by examiner

FLEXIBLE WIRING BOARDS

This is a Division of application Ser. No. 09/744,572 filed Feb. 28, 2001 and issued as U.S. Pat. No. 6,643,923 B1 on Nov. 11, 2003, which in turn is a National Stage of PCT/JP99/04067, filed Jul. 29, 1999. The entire disclosure of the prior applications is hereby incorporated by reference herein in its entirety.

BACKGROUND OF THE INVENTION

1. Field of the Invention

The invention relates to the field of flexible wiring boards, particularly to a flexible wiring board capable of forming fine metal bumps and the flexible wiring board manufactured thereby.

2. Description of Related Art

FIG. 4(a)–(d) is a processing diagram showing a process for manufacturing a flexible wiring board of the related art. Referring to the processing diagram, the process is explained in order. At first, a copper foil is applied on a polyimide film 111 and then the copper foil is patterned into a copper wiring 112 (FIG. 4(a)).

Then, the surface of polyimide film 111 is irradiated with laser beam 114 (FIG. 4(b)) to form openings 115 having a predetermined diameter (FIG. 4(c)). At this stage, the top surface of copper wiring 112 is exposed at the bottoms of openings 115, and then copper wiring 112 is plated with copper while the bottom surface is protected with a resin film 117 so that copper grows in openings 115 to form metal bumps 116.

When a bare-chip semiconductor device is to be mounted on such a flexible wiring board 110, an anisotropic conductive film is applied on metal bumps 116 and bonding pads of the semiconductor device are brought into contact with metal bumps 116 via the anisotropic conductive film and pressure is applied. Then, circuits within the semiconductor device contact copper wiring 112 via the anisotropic conductive film and metal bumps 116.

Flexible wiring boards of this type 110 are recently much used because they are thin and light and freely foldable to provide a high mounting flexibility.

However, residues of polyimide film 111 remain on the top surface of metal wiring 112 exposed at the bottoms of openings 115 when openings 115 are formed with laser beam 114 as described above. Residues are removed by immersing the assembly in a chemical solution after openings 115 have been formed. However, it becomes more difficult for the chemical solution to penetrate into openings 115 as openings 115 become finer, and therefore more difficult to remove residues.

If residues cannot be removed, copper deposition speed varies from opening 115 to opening 115, whereby homogeneous metal bumps 116 cannot be formed.

Another problem is variation in the diameter of fine openings 115 (about 40 µm to 50 µm) formed by irradiating a rigid polyimide film 111 with laser beam 114, resulting in variation in the diameter and height of metal bumps 116 which causes failure of connection with semiconductor chips.

Still another problem is that it is difficult to reduce the spot diameter of high power laser beam 114, which makes it impossible to form openings 115 having a diameter smaller than 40 µm, contrary to the recent demand for finer openings 115.

SUMMARY OF THE INVENTION

An object of the invention is to provide a technique capable of forming fine metal bumps with good precision to overcome the above disadvantages of the related art.

To attain the above object, the invention provides a process comprising the steps of forming a mask film, patterned by exposure and development, on a metal foil and growing metal bumps on the metal foil exposed at the bottoms of openings in the mask film.

In the invention, the step of growing metal bumps is followed by the steps of removing the mask film, applying a liquid resin material to form a resin material coating on the surface of the metal foil on which the metal bumps have been formed, and then curing the resin material coating into a resin film.

In the invention, the resin material coating may consist of a plurality of layered coatings.

When the resin material coating consists of a plurality of layered coatings, at least the uppermost coating may be a thermoplastic coating.

In the invention, the surface of the resin material coating on the metal foil may be located below the height of the metal bumps.

In the invention, the height of said metal bumps from the surface of the resin film may be 35 µm or less.

In the invention, the curing step may be preceded by the step of etching surface portions of the resin material coating.

In the invention, the resin material may be a liquid containing a polyimide precursor to form the resin film from a polyimide.

In the invention, the step of forming a resin film may be followed by the step of partially etching the metal foil from the bottom surface to form a patterned metal wiring.

In this case, a support film may be formed on the bottom surface of the metal wiring.

In the invention, the support film may be partially etched to expose desired regions of the metal wiring.

Said process may further comprise the steps of bringing bonding lands of a semiconductor chip into contact with the metal bumps and applying heat and pressure to allow the resin film to develop adhesiveness, whereby the semiconductor chip is bonded to flexible wiring board.

The invention also provides a flexible wiring board manufactured by the process as defined above.

Flexible wiring boards of the invention include those having a semiconductor device connected to the metal bumps.

As defined above, the invention relates to a process for manufacturing a flexible wiring board having metal bumps and the flexible wiring board manufactured thereby.

In the invention, an exposable dry film or resist film is applied or deposited on a metal foil and patterned by exposure and development to form a mask film.

The metal foil is exposed at the bottoms of openings in the mask film, so that metal bumps grow at exposed regions of the metal foil when the metal foil is immersed in a plating solution while its bottom surface is protected.

The openings in the mask film can be formed in a fine size with high precision by photolithography. Therefore, the metal bumps can also be homogeneously grown both in width and height.

Then, a liquid resin material is applied and dried or otherwise treated to form a resin material coating on the surface of the metal foil on which the metal bumps have been formed, after which the resin material coating is heated or otherwise cured into a resin film, whereby the surface of the metal foil on which the fine metal bumps have been formed can be covered with the resin film. If the resin material coating has a thickness smaller than the height of metal bumps, the tops of the metal bumps may project from the surface of the resin film without post-treatment.

If the resin material cover the tops of the metal bumps, the resin film is also formed by curing on the surfaces of the metal bumps, which can be, however, exposed by polishing or etching.

If etching is used, an uncured resin material coating can be etched to form a resin film with the tops of the metal bumps being exposed.

The resin film may be a thermosetting or thermoplastic film or a laminate of such films as far as it is flexible. From the viewpoint of durability or reliability, it is preferable that the resin material is a polyimide precursor to be cured into a polyimide film.

After the resin film has been formed, the bottom surface of the metal foil can be exposed and etched using a dry film or photoresist as a mask to give a copper wiring. Then, a support film can be formed on the bottom to protect the copper wiring, whereby a flexible wiring board having reliable insulating properties is obtained.

The resin film can be formed to have a multilayer structure by layering resin material coatings. If the uppermost layer of the resin film consists of a thermoplastic resin, the thermoplastic resin film develops adhesiveness upon heating to ensure bonding to a semiconductor device or the like without using an anisotropic conductive film.

The support film may be formed by applying a sheet-like film or coating a resin material solution as defined above and curing it. The support film may be patterned to partially expose desired regions of the metal wiring for forming contact regions for connection with another flexible wiring board or contact regions for wire bonding.

Variation in the height of metal bumps grown by electroplating increases with size. Experiments show that the variation is limited to ±3 μm when the height above the surface of the resin film is 35 μm or less in contrast to ±5 to ±7 μm observed when said height is 40 μm. When a non-flexible material such as a semiconductor chip is to be connected to metal bumps, the yield is more influenced by variation than bump height.

DETAILED DESCRIPTION OF PREFERRED EMBODIMENTS

The invention will now be described with reference to the attached drawings.

Figure 1A:
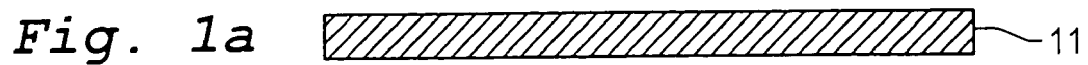
FIGS. 1(a)–1(p) are a processing diagram illustrating an example of process of the present invention.
Figure 1B:
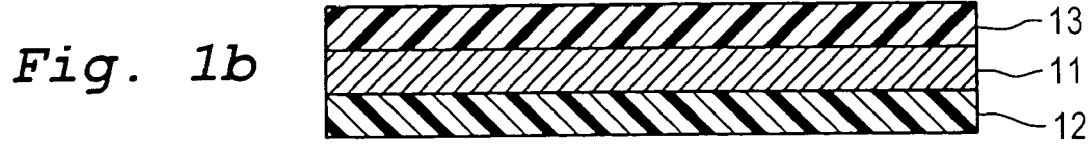
Figure 1C:
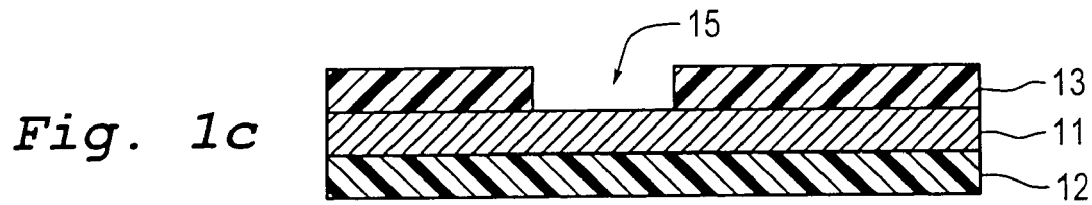
Figure 1D:
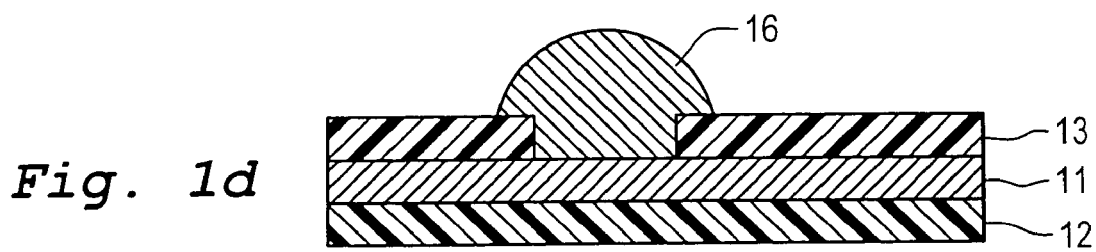
Figure 1E:
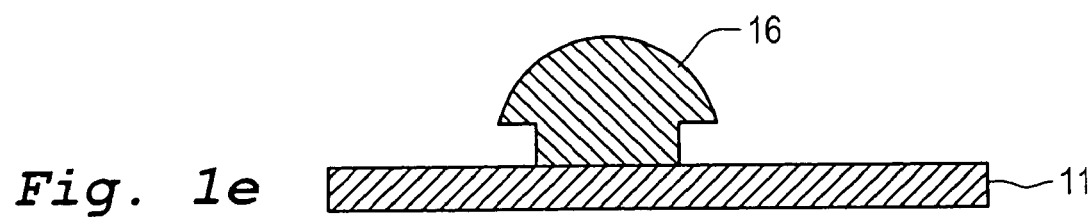
Figure 1F:
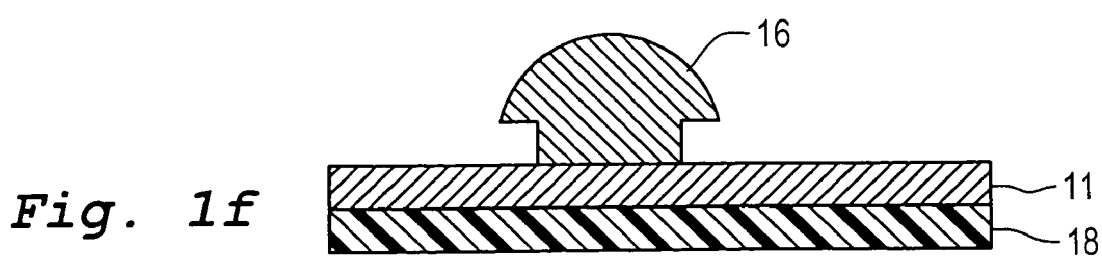
Figure 1G:
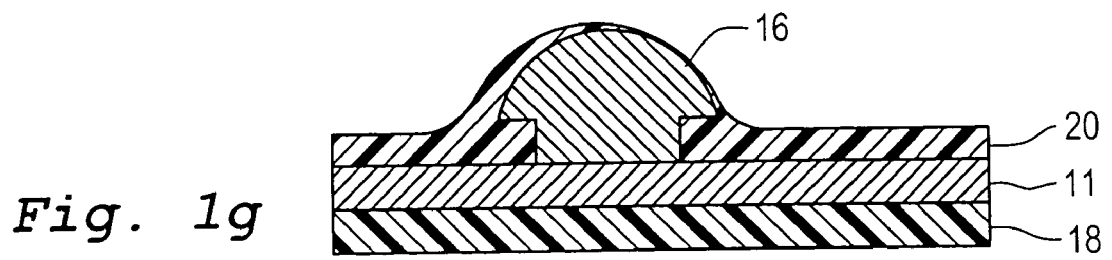
Figure 1H:
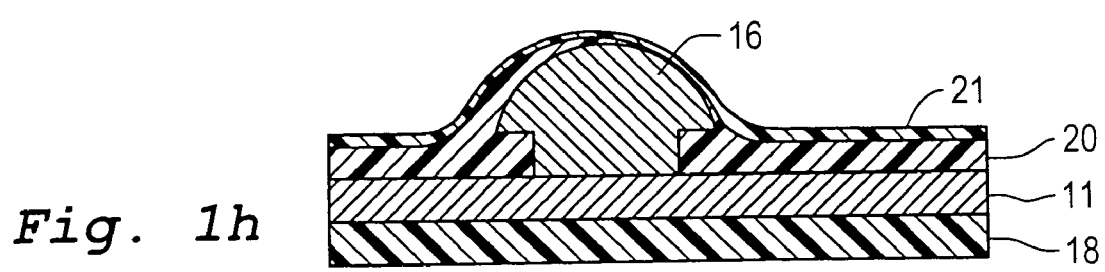
Figure 1I:
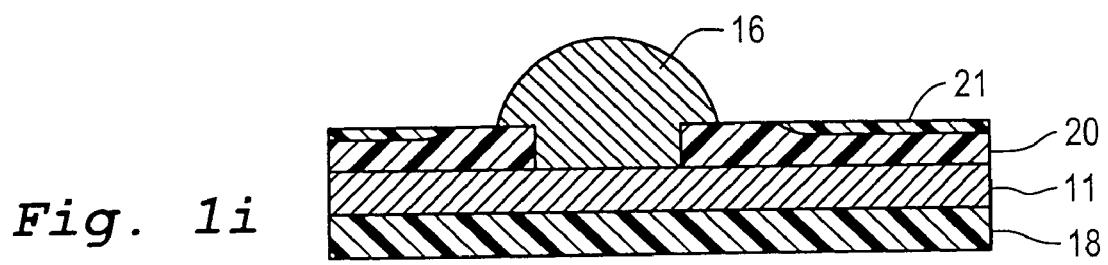
Figure 1J:
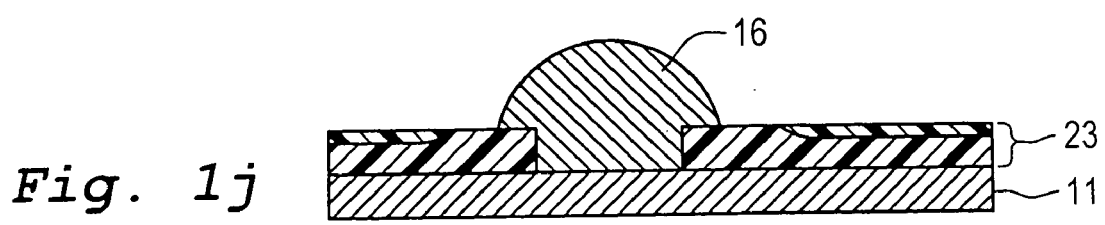
Figure 1K:
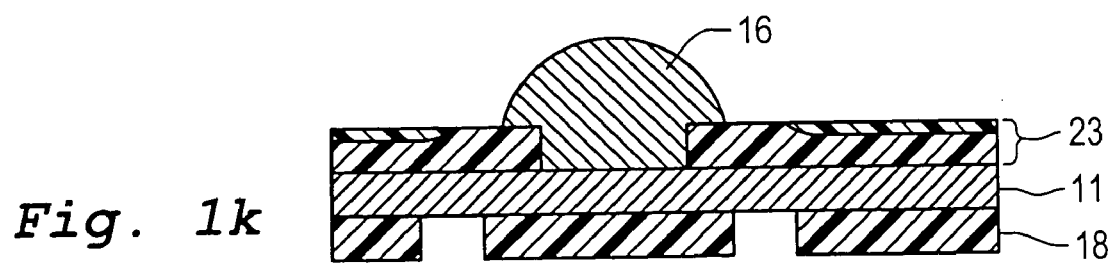
Figure 1L:
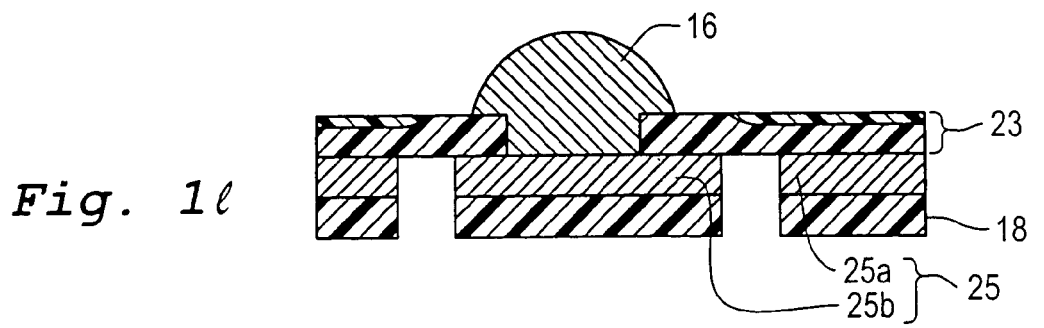
Figure 1M:
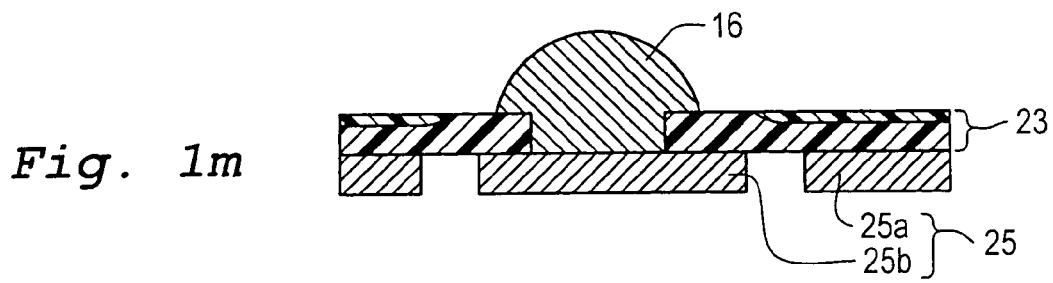
Figure 1N:
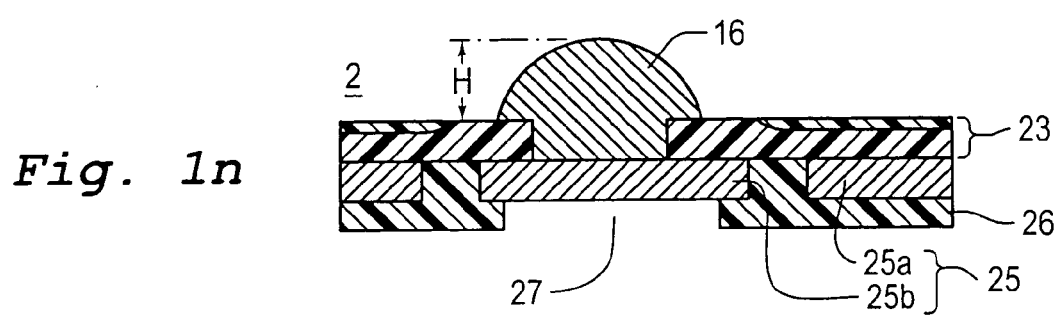
Figure 1O:
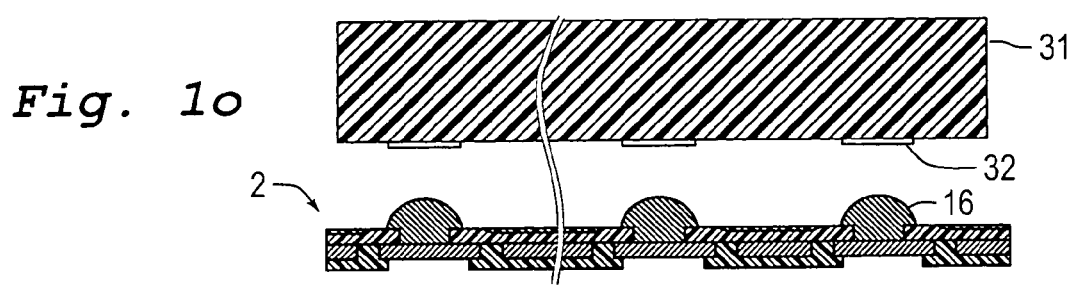
Figure 1P:

FIGS. 1(a)–1(p) are a processing diagram illustrating a process of the invention. The reference 2 in FIG. 1(n) represents an example of flexible wiring board of the invention manufactured by the process, and the reference 30 in FIG. 1(p) represents the flexible wiring board 2 having a semiconductor chip 31 connected thereto.

Referring to FIG. 1(a), a metal foil 11 (a rolled copper foil having a thickness of 18 μm here) is initially prepared, and a protective film 12 is applied on the bottom surface and a UV-exposable mask film 13 (dry film SPG-152 made by Asahi Chemical Industry Co., Ltd.) is applied on the top surface (at a temperature of 130° C. and a line speed of 2 m/min here) (FIG. 1(b)).

Then, mask film 13 is exposed to light (exposure light intensity 100 mJ) through a glass mask having a predetermined pattern and developed with a chemical solution to form openings 15 at locations corresponding to a plurality of metal bumps 16 described below (FIG. 1(c)). Openings 15 can be formed with a precision within ±2.5 μm in diameter and a precision within ±2 μm in height using a mask having a circular pattern of 30 to 50 μm in diameter.

Then, the assembly is immersed in an electrolyte for copper plating and electric current is applied to grow copper into metal bumps 16 on the top surface of metal foil 11 exposed at the bottoms of openings 15 (FIG. 1(d)). Metal bumps 16 standing on a plurality of openings 15 have a homogeneous height with good precision because no residues remain on the top surface of metal foil 11 exposed at the bottoms of openings 15 after development. Instead a clean surface is exposed.

Then, mask film 13 and protective film 12 are removed with an alkali (FIG. 1(e)). At this stage, a plurality of mushroom-like metal bumps 16 are upright on the top surface of metal foil 11. A carrier film 18 is applied on the bottom of metal foil 11 (FIG. 1(f)), and then a resin material consisting of a polyimide precursor is applied on the top surface of metal foil 11 and dried to form a resin material coating 20 consisting of the polyimide precursor (FIG. 1(g)).

This resin material coating 20 is convex on metal bumps 16 and their vicinities, but flat away from metal bumps 16. The thickness of flat regions is smaller than the height of metal bumps 16 so that the tops of metal bumps 16 may project from flat regions on resin material coating 20.

If resin material coating 20 is too thin with a single application, an additional resin material consisting of a polyimide precursor may be applied on the previously formed resin material coating 20 and dried to layer a second resin material coating thereon. The reference 21 in FIG. 1(h) represents such a second resin material coating layered on resin material coating 20. The upper resin material coating 21 here is thermoplastic, contrary to the lower resin material coating 20.

Figure 3A:
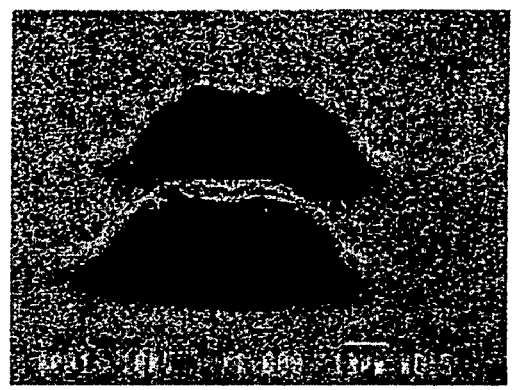
FIG. 3(a) is a surface microphotograph of metal bumps and their vicinities on which a resin material coating has been formed.
Figure 3B:
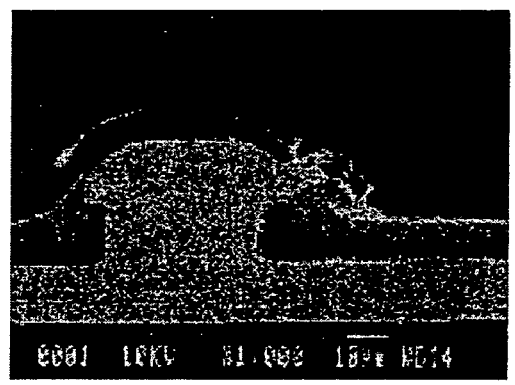
FIG. 3(b) is a sectional microphotograph of one of the metal bumps.
Figure 3C:
FIG. 3(c) is a surface microphotograph of metal bumps and their vicinities on which a resin film has been formed.
Figure 3D:
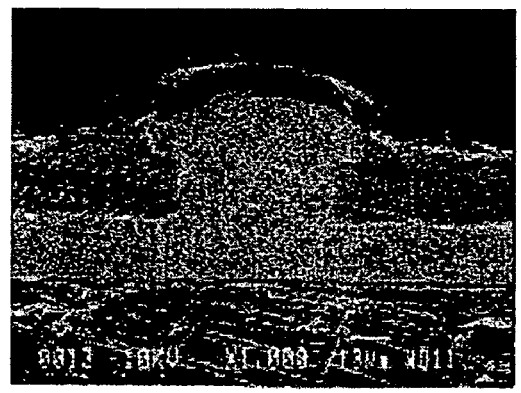
FIG. 3(d) is a sectional microphotograph of one of the metal bumps.
Figure 4A:
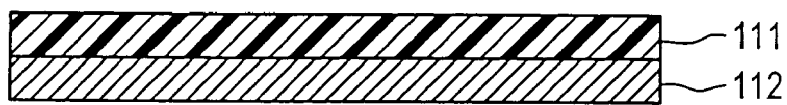
FIGS. 4(a)–4(d) are a processing diagram illustrating a process for manufacturing a flexible wiring board of the related art.
Figure 4B:
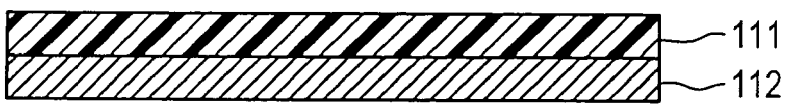
Figure 4C:
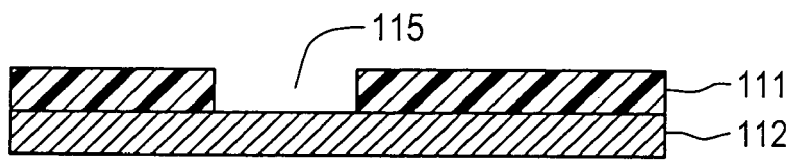
Figure 4D:
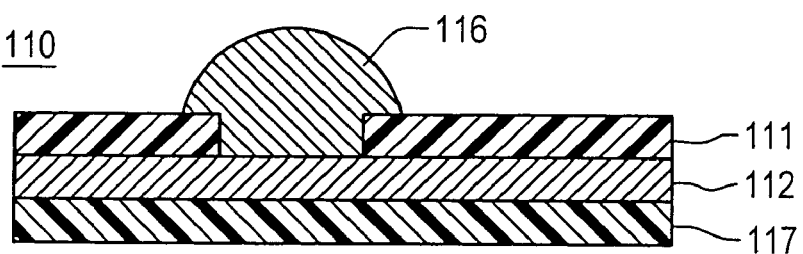

A surface microphotograph of vicinities of metal bumps 16 at this stage is shown in FIG. 3(a). A sectional microphotograph is shown in FIG. 3(b). The tops of metal bumps 16 are covered with resin material coatings 20, 21.

Then, an alkaline solution is sprayed on resin material coatings 20, 21 to etch the surface. Here, a depth of 2–5 μm from the surface is etched by spraying at 25° C. for 20 seconds to expose the tops of metal bumps 16 (FIG. 1(i)). A plasma cleaner may be used for etching instead of spraying an alkaline solution.

Then, carrier film 18 on the bottom is removed and then resin material coatings 20, 21 are cured by heating (280° C. for 10 minutes) to form a resin film 23 consisting of two polyimide film layers on the top surface of metal foil 11 (FIG. 1(*j*)).

A surface microphotograph of metal bumps 16 at this stage is shown in FIG. 3(*c*) and a sectional microphotograph is shown in FIG. 3(*d*). The surfaces of the tops of metal bumps 16 are exposed, though indiscernible from FIG. 3(*c*) and FIG. 3(*d*). The upper layer of resin film 23 is thermoplastic so that it is not necessary to use an anisotropic conductive film for connecting a semiconductor device or the like.

A photosensitive resin film is applied on the bottom surface of metal foil 11 and patterned by exposure and development into a predetermined configuration to form a mask film 24 (FIG. 1(*k*)). Then, the pattern of mask film 24 is transferred to metal foil 11 by etching, to form a metal wiring 25 (FIG. 1(*l*)).

This metal wiring 25 has line-shaped wiring regions $25_a$ and large-area contact regions $25_b$ located at the bottoms of metal bumps 16, so that metal bumps 16 can be connected to outer terminals or ICs via contact regions $25_b$ and wiring regions $25_a$.

Mask film 24 is removed (FIG. 1(*m*)) and a polyimide precursor is applied on the exposed bottom surface of metal wiring 25 and dried and then patterned using a photosensitive resist to expose contact regions $25_b$. Then, the assembly is heated and a support film 26 consisting of a polyimide is formed on the bottom of metal wiring 25 to give a flexible wiring board 2 (FIG. 1(*n*)). The height of metal bumps 16 of this flexible wiring board 2 from the surface of resin film 23 is 35 μm or less.

In flexible wiring board 2, the top and bottom surface of metal wiring 25 are protected with resin film 23 and support film 26, respectively, and the tops of metal bumps 16 project from the surface of resin film 23. The bottoms 27 of contact regions $25_b$ are exposed.

Figure 2:
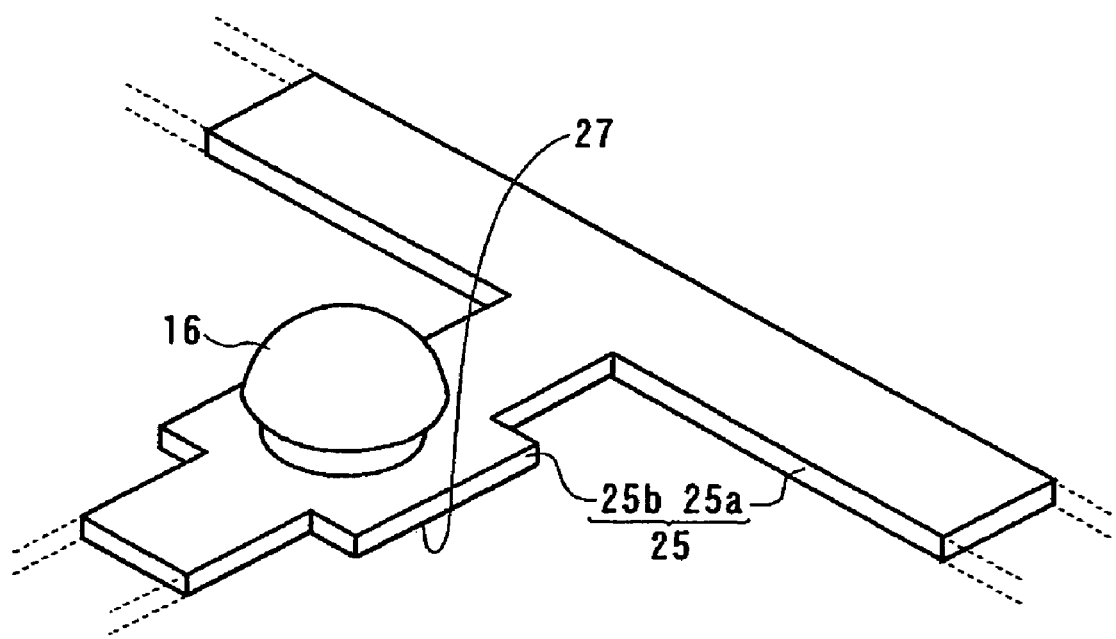
FIG. 2 is a perspective view of a metal bump and a metal wiring.

FIG. 2 is a perspective view of metal wiring 25 and metal bump 16, in which polyimide films 23, 26 are not shown.

Next, a process for mounting a semiconductor chip on flexible wiring board 2, having the structure described above, is explained.

FIG. 1(*o*) shows the state in which semiconductor chip 31 is ready to be mounted on flexible wiring board 2. A plurality of bonding pads 32 consisting of an aluminium thin film are exposed on the surface of this semiconductor chip 31, and metal bumps 16 formed on flexible wiring board 2 are provided to face bonding pads 32.

Semiconductor chip 31 is pressed against flexible wiring board 2 via each bonding pad 32 of this semiconductor chip 31 in contact with the counterpart metal bump 16, whereby resin film 23 exposed between metal bumps 16 tightly contact the surface of semiconductor chip 31.

When semiconductor chip 31 or flexible wiring board 2 is heated during the pressing step, resin film 23 develops adhesiveness to bond semiconductor chip 31 to flexible wiring board 2.

When the assembly is cooled as such, semiconductor chip 31 is fixed to flexible wiring board 2 while maintaining electric connection between bonding pads 32 and metal bumps 16. The reference 30 in FIG. 1(*p*) represents a flexible wiring board on which semiconductor chip 31 is fixed.

The tops of metal bumps 16 of another flexible wiring board 2 having a similar structure may be brought into contact with contact regions $25_b$ of the former flexible wiring board 2, and the flexible wiring boards 2 are connected together by means of adhesiveness of resin film 23 of the former flexible wiring board 2.

Table 1 below shows the relation between bump height and connection failure when an IC chip (a kind of semiconductor chip) is connected to bumps 16 of flexible wiring board 2 or when flexible wiring boards 2 are connected together (connection between bumps 16 and bottoms 27 of contact regions $25_b$). PCT (Pressure Cooker Test) was performed under conditions of 121° C., 2 atm. for 24 hours. All heights of 35 μm or less passed PCT without showing any failure point even after PCT.

TABLE 1

Bump height and connection results

| Description | | Example 1 | Example 2 | Example 3 | Example 4 | Comparative example 1 | Comparative example 2 | Comparative example 3 |
|---|---|---|---|---|---|---|---|---|
| Bump height (μm) | | 0 | 10 | 10 | 35 | 37 | 40 | 55 |
| Range of variation in bump height (μm) | | 1 | 1 | 1 | 2 | 3 | 4 | 6 |
| Device bonded | | Wiring board | Wiring board | IC chip | Wiring board | Wiring board | IC chip | Wiring board |
| Number of success points among 25 connection points | Before PCT | 25 | 25 | 25 | 25 | 25 | 25 | 18 |
| | After PCT | 25 | 25 | 25 | 25 | 24 | 16 | 0 |
| Connection result | | Pass | Pass | Pass | Pass | Fail | Fail | Fail |

In flexible wiring board 2 of the invention as described above, a resin film is formed after metal bumps 16 are formed, therefore, it is not necessary to form openings in the resin film with laser beam. Thus, fine metal bumps can be formed with good precision.

Although copper was grown by plating to form metal bumps 16 in the above example, other metals may also be used. Metal foil 11 is not limited to copper, either. Resin coatings 23, 26 may have a monolayer structure or a two-layer structure and may not be formed from a polyimide.

It is preferable to form a gold coating (thickness of about 1–2 μm) by plating or other means on the surfaces of metal bumps 16 consisting of copper. A chip-like semiconductor can be connected to such metal bumps 16 via an anisotropic conductive film or the like to prepare a circuit component.

Metal bumps formed on another flexible wiring board can also be connected to contact regions $25_b$ to connect flexible wiring boards together. Therefore, a plurality of flexible wiring boards of the invention can be layered.

In the invention, fine metal bumps can be formed with good precision.

A desired shape of opening (for example, square or hexagonal) can be formed because laser beam is not used.

The selection of bump height of 35 μm or less decreases variation in bump height to reduce failure of connection with non-flexible semiconductor chips such as IC chips.

What is claimed is:

1. A flexible wiring board, comprising:
   a metal foil not patterned;
   a resin film having flexibility disposed on a top surface of said metal foil; and
   metal bumps of which bottoms are connected to the top surface of said metal foil,
   wherein no metal bumps are disposed on a bottom surface of said metal foil, the bottom surface being flat, and the tops of said metal bumps are projected from said resin film,
   wherein said resin film includes a thermosetting resin film and a thermoplastic resin film developing adhesiveness upon heating, said thermosetting resin film contacts said metal foil, and said thermoplastic resin film is disposed on the surface of said thermosetting resin film, said thermoplastic resin film is exposed, and
   wherein said thermosetting resin film is disposed in the vicinities of said metal bumps, sides of said metal bumps are surrounded by said thermosetting resin film, and said thermosetting resin film is exposed on the surface of the vicinities of said metal bumps.

2. The flexible wiring board according to claim 1, wherein said thermoplastic resin film and said thermosetting resin film are polyamide films.

3. A flexible wiring board, comprising:
   a metal wiring patterned;
   a resin film having flexibility disposed on a top surface of said metal wiring; and
   metal bumps having corresponding bottoms and tops, the bottoms being connected to the top surface of said metal wiring and the tops project through said resin film,
   wherein said resin film includes a thermosetting resin film and a thermoplastic resin film developing adhesiveness upon heating, said thermosetting resin film contacts said metal wiring, said thermoplastic resin film is disposed on a surface of said thermosetting resin film, and said thermoplastic resin film is exposed, and
   wherein said thermosetting resin film is disposed in the vicinities of said metal bumps, sides of said metal bumps are surrounded by said thermosetting resin film, and said thermosetting resin film is exposed on the surface of the vicinities of said metal bumps.

4. The flexible wiring board according to claim 3, further comprising:
   a support film disposed on a bottom surface of said metal wiring; and
   openings formed on said support film, said metal wiring being exposed at a bottom of each of said openings.

5. The flexible wiring board according to claim 3, said metal bumps are connected to bonding pads of a semiconductor chip, and said semiconductor chip is bonded by means of adhesiveness of said thermoplastic resin film.

6. The flexible wiring board comprising first and second flexible wiring boards according to claim 3, being layered,
   wherein said metal bumps of said first flexible wiring board are connected to said metal wiring of said second flexible wiring board located at the bottoms of openings of said second flexible wiring board, and said first flexible wiring board is bonded to said support film of said second flexible wiring board by means of adhesiveness of said thermoplastic resin film.

* * * * *